(12) United States Patent
Park

(10) Patent No.: US 11,441,484 B2
(45) Date of Patent: Sep. 13, 2022

(54) VERTICAL-CAVITY SURFACE-EMITTING LASER DEVICE

(71) Applicant: SEOUL VIOSYS CO., LTD., Ansan-si (KR)

(72) Inventor: Seong Joo Park, Ansan-si (KR)

(73) Assignee: Seoul Viosys Co., Ltd., Ansan-si (KR)

( * ) Notice: Subject to any disclaimer, the term of this patent is extended or adjusted under 35 U.S.C. 154(b) by 256 days.

(21) Appl. No.: 16/820,486

(22) Filed: Mar. 16, 2020

(65) Prior Publication Data
US 2020/0303904 A1    Sep. 24, 2020

Related U.S. Application Data

(60) Provisional application No. 62/820,967, filed on Mar. 20, 2019.

(51) Int. Cl.
*H01S 5/183* (2006.01)
*H01S 5/20* (2006.01)
(Continued)

(52) U.S. Cl.
CPC ........... *F02C 7/224* (2013.01); *F02C 7/14* (2013.01); *F02C 7/232* (2013.01); *F02C 9/28* (2013.01); *H01S 5/0421* (2013.01); *H01S 5/18305* (2013.01); *H01S 5/18344* (2013.01); *H01S 5/18369* (2013.01); *H01S 5/209* (2013.01);
(Continued)

(58) Field of Classification Search
CPC ........... H01S 5/0421; H01S 5/18305; H01S 5/18344; H01S 5/18369; H01S 5/209; H01S 5/3054; H01S 5/3095; H01S 5/34366
See application file for complete search history.

(56) References Cited

U.S. PATENT DOCUMENTS 6,515,308 B1 * 2/2003 Kneissl ............... H01S 5/18341
257/104
7,957,447 B2   6/2011 Matsushita et al.
(Continued)

FOREIGN PATENT DOCUMENTS

KR      10-0484490       4/2005
KR   10-2006-0050164     5/2006
(Continued)

OTHER PUBLICATIONS

International Search Report dated Jul. 6, 2020 in International Patent Application No. PCT/KR2020/003704.

*Primary Examiner* — Yuanda Zhang
(74) *Attorney, Agent, or Firm* — H.C. Park & Associates, PLC

(57) ABSTRACT

A vertical-cavity surface-emitting laser device including a lower mirror, an upper mirror disposed over the lower mirror, an active region disposed between the lower mirror and the upper mirror, a lower n-type cladding layer disposed between the active region and the lower mirror, an upper n-type cladding layer disposed between the active region and the upper mirror, a heavily doped p-type semiconductor layer disposed between the active region and the upper n-type cladding layer, and a heavily doped n-type semiconductor layer disposed between the heavily doped p-type semiconductor layer and the upper n-type cladding layer to form a tunnel junction with the heavily doped p-type semiconductor layer.

19 Claims, 6 Drawing Sheets

(51) Int. Cl.

| | |
|---|---|
| *H01S 5/30* | (2006.01) |
| *F02C 7/224* | (2006.01) |
| *H01S 5/042* | (2006.01) |
| *H01S 5/343* | (2006.01) |
| *F02C 7/14* | (2006.01) |
| *F02C 7/232* | (2006.01) |
| *F02C 9/28* | (2006.01) |

(52) U.S. Cl.
 CPC .......... *H01S 5/3054* (2013.01); *H01S 5/3095* (2013.01); *H01S 5/34366* (2013.01); *F05D 2260/213* (2013.01); *F05D 2270/3062* (2013.01)

(56) References Cited

U.S. PATENT DOCUMENTS

| | | |
|---|---|---|
| 2002/0071464 A1 | 6/2002 | Coldren et al. |
| 2005/0253222 A1* | 11/2005 | Caneau ............... H01S 5/18308 257/607 |
| 2006/0013276 A1 | 1/2006 | McHugo |

FOREIGN PATENT DOCUMENTS

| | | |
|---|---|---|
| KR | 10-0623406 | 9/2006 |
| KR | 10-2009-0052266 | 5/2009 |

* cited by examiner

VERTICAL-CAVITY SURFACE-EMITTING LASER DEVICE

CROSS-REFERENCE TO RELATED APPLICATION

This application claims the benefit of U.S. Provisional Application No. 62/820,967, filed on Mar. 20, 2019, which is hereby incorporated by reference for all purposes as if fully set forth herein.

BACKGROUND

Field

Exemplary embodiments of the invention relate generally to a vertical-cavity surface-emitting laser device, and more specifically, to a high efficiency and low resistance vertical-cavity surface-emitting laser device.

Discussion of the Background

A vertical-cavity surface-emitting laser device is used as a light source for short/medium distance communications. In particular, the vertical-cavity surface-emitting laser has high fiber-coupling efficiency, low laser fabrication cost, low mounting cost, and low electrical power consumption, and, due to its ability to form two-dimensional arrays, its use has been expanding as a light source for next-generation optical communication and signal processing.

Since the vertical-cavity surface-emitting laser device has a current flowing in a direction perpendicular to a substrate surface unlike an edge type laser device, it is necessary to narrowly limit a region through which the current flows. To this end, a method of defining a laser region by making the laser region into a post or forming an insulating region through ion implantation is used. Furthermore, a method of forming an oxide layer to define an aperture, which is a region for current to pass through, is mainly used.

Meanwhile, the vertical-cavity surface-emitting laser device includes an active region between an n-type contact layer and a p-type contact layer. When electrodes are formed in the n-type contact layer and the p-type contact layer and currents are injected, light is generated in the active region. Light generated in the active region is amplified between a lower mirror and an upper mirror, and is emitted to the outside through one of the mirrors. Accordingly, a laser beam passes through various semiconductor layers disposed between the lower mirror and the upper mirror.

However, in an n-type semiconductor region including the n-type contact layer and a p-type semiconductor region including the p-type contact layer, heat generated in the active region is not uniformly released due to a difference in conductivity. In particular, since the p-type semiconductor region generally has lower conductivity than that of the n-type semiconductor region, heat dissipation through the p-type semiconductor region is not favorable. As such, heat dissipation may be a problem in a laser structure in which heat has to be mainly dissipated through the p-type semiconductor region.

Furthermore, since p-type dopants doped in the p-type semiconductor region absorb light better than n-type dopants, light loss in the p-type semiconductor region is substantial. Furthermore, since a contact resistance between the electrode and the p-type contact layer is generally significantly higher than that between the electrode and the n-type contact layer, a forward voltage of the laser device is increased.

The above information disclosed in this Background section is only for understanding of the background of the inventive concepts, and, therefore, it may contain information that does not constitute prior art.

SUMMARY

Vertical-cavity surface-emitting lasers constructed according to exemplary embodiments of the invention are capable of reducing contact resistance, reducing light loss caused by p-type dopants between a lower mirror and an upper mirror.

Exemplary embodiments also provide a vertical-cavity surface-emitting laser device having improved heat dissipation performance through a p-type semiconductor region.

Additional features of the inventive concepts will be set forth in the description which follows, and in part will be apparent from the description, or may be learned by practice of the inventive concepts.

A vertical-cavity surface-emitting laser device according to one embodiment of the present disclosure includes: a lower mirror; an upper mirror disposed over the lower mirror; an active region disposed between the lower mirror and the upper mirror; a lower n-type cladding layer disposed between the active region and the lower mirror; an upper n-type cladding layer disposed between the active region and the upper mirror; a heavily doped p-type semiconductor layer disposed between the active region and the upper n-type cladding layer; and a heavily doped n-type semiconductor layer disposed between the heavily doped p-type semiconductor layer and the upper n-type cladding layer to form a tunnel junction with the heavily doped p-type semiconductor layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
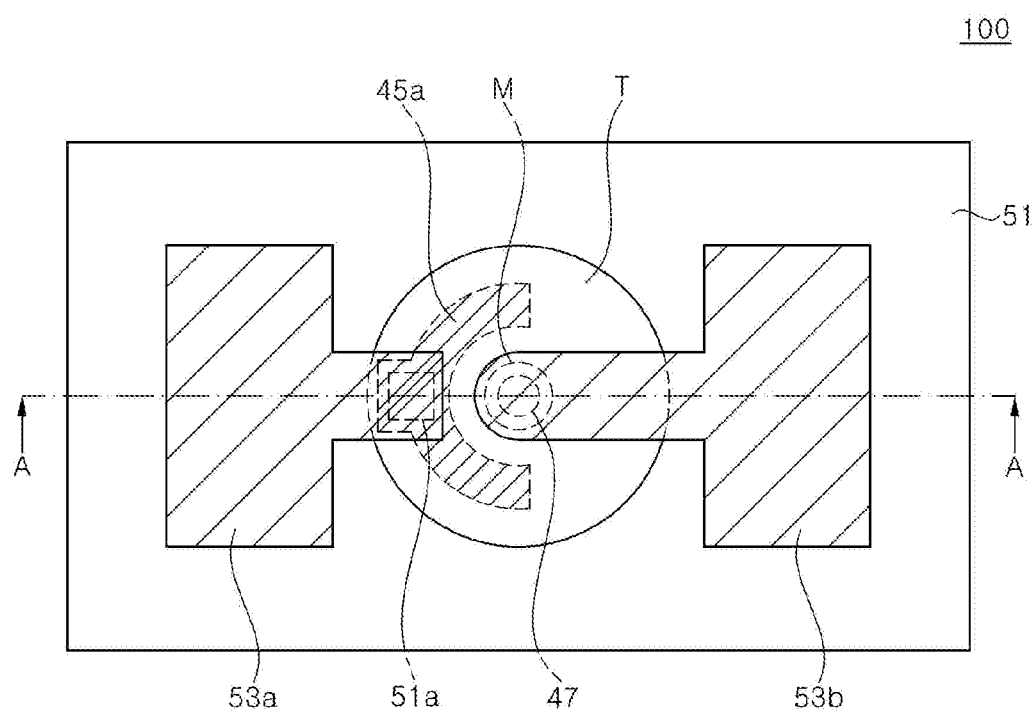
FIG. 1 is a schematic plan view illustrating a vertical-cavity surface-emitting laser device according to an exemplary embodiment.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

A vertical-cavity surface-emitting laser device according to an exemplary embodiment includes: a lower mirror; an upper mirror disposed over the lower mirror; an active region disposed between the lower mirror and the upper mirror; a lower n-type cladding layer disposed between the active region and the lower mirror; an upper n-type cladding layer disposed between the active region and the upper mirror; a heavily doped p-type semiconductor layer disposed between the active region and the upper n-type cladding layer; and a heavily doped n-type semiconductor layer disposed between the heavily doped p-type semiconductor layer and the upper n-type cladding layer to form a tunnel junction with the heavily doped p-type semiconductor layer.

Since the tunnel junction is used and the n-type cladding layer is used instead of the p-type cladding layer, heat dissipation performance of the laser device may be improved, and heat loss and resistance caused by the p-type cladding layer may be reduced.

As used herein, the term "heavily doped" may refer an n-type or p-type impurity doping concentration of $1E19/cm^3$ or more, and is represented by p++ or n++.

The heavily doped p-type semiconductor layer may include p++ InAlAs or p++ InAlGaAs.

The heavily doped n-type semiconductor layer may include n++ InP, n++ InAlGaAs or n++ InAlAs.

The heavily doped n-type and p-type semiconductor layers may have a doping concentration in a range of $2E19\ cm^3$ to $5E19/cm^3$, respectively.

The laser device may further include an etch stop layer disposed between the active region and the heavily doped p-type semiconductor layer. The etch stop layer protects the active region during wet etching the heavily doped p-type semiconductor layer.

The etch stop layer may include p-type InP.

The active region may include barrier layers and a well layer disposed between the barrier layers, in which the barrier layers and the well layer may include an InAlGaAs-based semiconductor.

The laser device may also further include InAlGaAs-based spacer layers in contact with the active region and disposed on both sides of the active region. A separate confinement heterostructure (SCH) may be formed by the spacer layers.

The lower and upper n-type cladding layers may include an n-type contact layer, respectively.

The n-type contact layer may include n+ InP having a doping concentration in a range of $5E18/cm^3$ to $1E19/cm^3$.

The laser device may further include a lower ohmic contact layer and an upper ohmic contact layer connected to the lower n-type cladding layer and the upper n-type cladding layer, respectively.

The lower and upper ohmic contact layers may include AuGe.

Since the lower and upper ohmic contact layers include AuGe, these ohmic contact layers may be formed together in the same process, thereby simplifying a manufacturing process.

The laser device may further include an insulation layer partially disposed between the upper n-type cladding layer and the upper ohmic contact layer, and separating an outer edge of the upper ohmic contact layer from the upper n-type cladding layer.

Since the insulation layer is disposed under the outer edge of the upper ohmic contact layer, the electrical stability of the laser device may be improved.

The lower mirror may be a distributed Bragg reflector formed by repeatedly stacking InAlAs and InAlGaAs one above another, and the upper mirror may be a distributed Bragg reflector formed by repeatedly stacking dielectric layers having different refractive indices one above another.

The laser device may include a ring-shaped trench exposing the lower n-type cladding layer; and a mesa surrounded by the trench, in which the mesa may include the active region, the heavily doped p-type semiconductor layer, and the n-type semiconductor layer, and the upper n-type cladding layer, and the upper mirror may be disposed on the upper n-type cladding layer on the mesa.

The laser device may further include an upper ohmic contact layer disposed in a ring shape around the upper mirror and in ohmic contact with the upper n-type cladding layer; and a lower ohmic contact layer being in ohmic contact with the lower n-type cladding layer exposed through the trench. In addition, the laser device may further include a metal reflection layer covering the upper mirror.

The laser device may further include first and second electrode pads electrically connected to the lower ohmic contact layer and the metal reflection layer, respectively.

The laser device may further include an upper insulation layer covering sidewalls and bottom of the trench, the upper insulation layer having openings exposing the lower ohmic contact layer and the metal reflection layer, wherein the first and second electrode pads may be disposed on the upper insulation layer, and electrically connect to the lower ohmic contact layer and the metal reflection layer through the openings, respectively.

The laser device may further include an InP substrate disposed under the lower mirror, wherein laser beam may be emitted through the substrate.

Hereinafter, a vertical-cavity surface-emitting laser device according to exemplary embodiments will be described in more detail with reference to the drawings.

Figure 2:
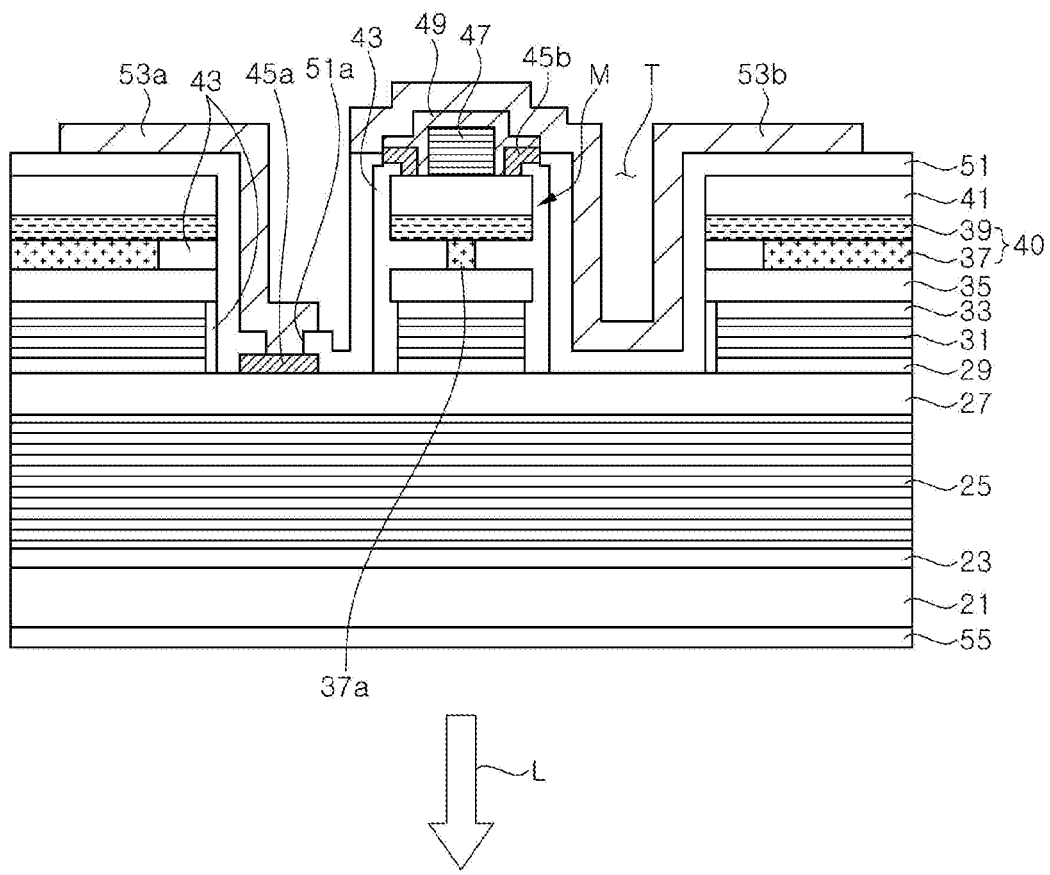
FIG. 2 is a cross-sectional view taken along line A-A of FIG. 1.

FIG. 1 is a schematic plan view illustrating a vertical-cavity surface-emitting laser device according to an exemplary embodiment, and FIG. 2 is a cross-sectional view taken along line A-A of FIG. 1

Referring to FIG. 1 and FIG. 2, the laser device may include a substrate 21, a buffer layer 23, a lower mirror 25, a lower n-type cladding layer 27, a lower spacer layer 29, an active region 31, an upper spacer layer 33, an etch stop layer 35, a heavily doped p-type semiconductor layer 37, a heavily doped n-type semiconductor layer 39, an upper n-type cladding layer 41, a lower insulation layer 43, a lower ohmic contact layer 45a, an upper ohmic contact layer 45b, an upper mirror 47, a metal reflection layer 49, an upper insulation layer 51, a first electrode pad 53a, a second electrode pad 53b, and an anti-reflection layer 55.

The substrate 21 supports the laser device. The substrate 21 may be a transparent substrate capable of transmitting light generated in the active region 31, such as an InP substrate. The substrate 21 may be a semi-insulating substrate, and may be counted doped with Fe. The substrate 21 may have a thickness, for example, in a range of about 100 μm to about 150 μm.

The buffer layer 23 covers a surface of the substrate 21 to improve crystallinity of the semiconductor layer grown thereon. The buffer layer 23 may be, for example, formed of undoped InP. The buffer layer 23 improves the crystallinity of compound semiconductors formed on the InP substrate 21, such as InAlGaAs and InAlAs.

The lower mirror 25 may be formed of a distributed Bragg reflector (DBR), in which compound semiconductor layers having different refractive indices are alternately stacked one above another. Each semiconductor layer may be formed to have a thickness of approximately one quarter of a lasing wavelength in each semiconductor layer.

These compound semiconductor layers may be formed without being doped to improve crystallinity and prevent light loss. The lower mirror 25 may be formed of, for example, $In_yAl_xGa_{1-x-y}As/In_zAl_wGa_{1-w-y}As$ (0<x, y, z, w<1)). In one exemplary embodiment, to facilitate the formation of the lower mirror 25, a composition ratio of In may be set to be constant and composition ratios of Al and Ga may be adjusted, and thus, layers having different refractive indices may be alternately formed. For example, the lower mirror 25 may be formed by alternately stacking $In_{0.52}Al_{0.15}Ga_{0.33}As$ and $In_{0.52}Al_{0.48}As$.

In order to increase a reflectance of the lower mirror 25, a layer having a relatively higher refractive index difference than layers in contact with the lower mirror 25 may be used as the first layer and the last layer of the lower mirror 25. For example, when the buffer layer 23 and the lower n-type cladding layer 27 are formed of InP (refractive index: about 3.170), an InAlGaAs layer having a higher refractive index than that of InAlAs may be disposed at the first and the last of the lower mirror 25.

The lower n-type cladding layer 27 includes an n-type contact layer. The n-type contact layer forms an upper surface of the lower n-type cladding layer 27. The lower n-type cladding layer 27 may also include a lightly doped layer disposed between the lower mirror 25 and the n-type contact layer. The lower n-type cladding layer 27 may be formed of InP doped with an n-type impurity, for example, Si. The n-type contact layer may have a doping concentration of, for example, $5E18/cm^3$ to $1E19/cm^3$, and the lightly doped layer may have a doping concentration of $1E18/cm^3$ to $2E18/cm^3$. The lower n-type cladding layer 27 may be formed to have a thickness of an integer multiple of ¼ of a wavelength of light generated in the active region 31, and may be formed to have a thickness of, for example, $2.5\lambda$.

The active region 31 is disposed on the lower n-type cladding layer 27. The active region 31 may be formed of a single quantum well structure or a multiple quantum well structure, and includes barrier layers and at least one well layer. The active region 31 may be formed of, for example, a multiple quantum well structure including seven well layers. The barrier layers and well layers may be formed with an InAlGaAs-based compound semiconductor without doping. In addition, tensile strain may be applied to the barrier layer and compressive strain may be applied to the well layer.

The lower and upper spacer layers 29 and 33 may be disposed on upper and lower surfaces of the active region 31, respectively. The lower spacer layer 29 and the upper spacer layer 33 may be formed of an InAlGaAs-based compound semiconductor, and may form a separate confinement heterostructure (SCH).

The etch stop layer 35 prevents the active region 31 from being damaged while wet etching the heavily doped p-type semiconductor layer 37. The etch stop layer 35 may be formed of, for example, p-type InP, and may be doped at a concentration of about $1E18/cm^3$ to $2E18/cm^3$. As a p-type impurity, Zn may be used, for example.

The heavily doped p-type semiconductor layer 37 is disposed on the etch stop layer 35. The heavily doped p-type semiconductor layer 37 may include, for example, carbon (C) as a p-type impurity, and may have a doping concentration of, for example, $2E19/cm^3$ to $5E19/cm^3$. The heavily doped p-type semiconductor layer 37 may form an aperture 37a limiting flow of current, and thus, may also be referred to as an aperture forming layer. To form the aperture 37a, the heavily doped p-type semiconductor layer 37 may include, for example, p++ InAlAs or p++ InAlGaAs.

The heavily doped n-type semiconductor layer 39 forms a tunnel junction with the heavily doped p-type semiconductor layer 37. Accordingly, a tunnel junction layer 40 including the heavily doped n-type semiconductor layer 39 and the heavily doped p-type semiconductor layer 37 may be formed. For example, the heavily doped n-type semiconductor layer 39 may include n++ InP, and the heavily doped n-type semiconductor layer 39 may include n++ InAlGaAs or n++ InAlAs, which will be described later with reference to FIG. 10. The heavily doped n-type semiconductor layer 39 may include, for example, Si as an n-type impurity, and may have a doping concentration of, for example, $2E19/cm^3$ to $5E19/cm^3$.

The upper n-type cladding layer 41 may include an n-type contact layer. The n-type contact layer may have a Si doping concentration of, for example, $5E18/cm^3$ to $1E19/cm^3$. The upper n-type cladding layer 41 may include a lightly doped layer between the n-type contact layer and the heavily doped n-type semiconductor layer 39, and the lightly doped layer may have a Si doping concentration of, for example, $1E18/cm^3$ to $2E18/cm^3$. The upper n-type cladding layer 41 may be formed to have a thickness of an integer multiple of ¼ of a wavelength of light generated in the active region 31, and may be formed to have a thickness of, for example, 2.75.

A trench T exposing the lower n-type cladding layer 27 may be formed through the upper n-type cladding layer 41, the heavily doped n-type semiconductor layer 39, the heavily doped p-type semiconductor layer 37, the etch stop layer 35, and the spacer layers 33 and 29, and the active region 31. The trench T may be formed in a ring shape surrounding a mesa M.

In the mesa M, a side surface of the heavily doped p-type semiconductor layer 37 is recessed inwardly to form the aperture 37a. The aperture 37a may have a smaller area than that of the etch stop layer 35, and, further, may have a smaller area than that of the heavily doped n-type semiconductor layer 39.

An air gap formed by recessing the highly doped p-type semiconductor layer 37 may be filled with the lower insulation layer 43. In particular, the lower insulation layer 43 surrounds the aperture 37a so that current limitedly flows to the aperture 37a.

As shown in FIG. 2, the active region 31 and/or the spacer layers 29 and 33 may also be recessed, and the lower insulation layer 43 may also fill the recessed regions of the active region 31 and/or the spacer layers 29 and 33. However, recesses of the active region 31 and/or the spacer layers 29 and 33 may be formed smaller than that of the heavily doped p-type semiconductor layer 37.

The lower insulation layer 43 may be formed using an atomic layer deposition technique, and may be formed of $Al_2O_3$ or AlN, for example. As shown in FIG. 2, the lower insulation layer 43 may cover all of sidewalls of the mesa M, however, the inventive concepts are not limited thereto. For example, in some exemplary embodiments, the lower insulation layer 43 may be formed to expose the sidewalls of the mesa M.

The lower ohmic contact layer 45a may be disposed on the lower n-type cladding layer 27 exposed through the trench T. The lower ohmic contact layer 45a may be in ohmic contact with the lower n-type cladding layer 27. The lower ohmic contact layer 45a, as shown in FIG. 1, may have substantially an open ring shape around the mesa M.

The upper ohmic contact layer 45b may be in ohmic contact with the upper n-type cladding layer 41 on the mesa M. The upper ohmic contact layer 45b may have substantially a ring shape. Further, an outer edge of the upper ohmic contact layer 45b may be spaced apart from the upper n-type cladding layer 41 by the lower insulation layer 43 as shown in FIG. 2. Accordingly, it is possible to prevent the upper ohmic contact layer 45b from moving to a side surface of the mesa M to cause an electrical short circuit during a thermal treatment.

In the illustrated exemplary embodiment, since both of the lower and upper cladding layers 27 and 41 are n-type semiconductor layers, the lower and upper ohmic contact layers 45a and 45b may include the same contact layer, for example, AuGe. For example, the lower and upper ohmic contact layers 45a and 45b may be formed of AuGe/Ni/Au. However, the inventive concepts are not limited thereto, and in some exemplary embodiments, the lower and upper ohmic contact layers 45a and 45b may be formed of different metal layers.

The upper mirror 47 is disposed on the mesa M. The upper mirror 47 may be formed in a region surrounded by the upper ohmic contact layer 45b. In particular, the upper mirror 47 covers the aperture 37a to reflect light incident through the aperture 37a.

The upper mirror 47 may be formed of a DBR of semiconductors or dielectrics. The upper mirror 47 may be formed of, for example, InAlGaAs-based semiconductor layers, InP and InAlGaAs-based semiconductor layer, a titanium oxide film and a silicon oxide film, a silicon and silicon oxide film, a silicon and titanium oxide film, and the like.

The upper mirror 47 has a higher reflectance than that of the lower mirror 25, and, accordingly, a laser L generated between the upper mirror 47 and the lower mirror 25 is emitted to the outside through the lower mirror 25 as shown by the arrows in FIG. 2.

The reflectance of the upper mirror 47 is increased by covering the upper mirror 47 with the metal reflection layer 49. The metal reflection layer 49 may be formed of Ti/Au, for example. The metal reflection layer 49 may be electrically connected to the upper ohmic contact layer 45b.

The upper insulation layer 51 covers the upper n-type cladding layer 41 and covers inner walls of the trench T. The upper insulation layer 51 may also cover the lower ohmic contact layer 45a. However, the upper insulation layer 51 may have an opening 51a exposing the lower ohmic contact layer 45a. Furthermore, the upper insulation layer 51 may expose the metal reflection layer 49 to allow electrical connection to the lower ohmic contact layer 45a.

The first and second electrode pads 53a and 53b are disposed on the upper insulation layer 51. The first electrode pad 53a may be electrically connected to the lower ohmic contact layer 45a exposed through the opening 51a, and the second electrode pad 53b may be electrically connected to the upper ohmic contact layer 45b. As illustrated, the second electrode pad 53b may be connected to the metal reflection layer 49 to be electrically connected to the upper ohmic contact layer 45a. However, the inventive concepts are not limited thereto, and in some exemplary embodiments, the second electrode pad 53b may be directly connected to the upper ohmic contact layer 45a.

The anti-reflection layer 55 is formed on a lower surface of the substrate 21. The anti-reflection layer 55 prevents reflection of the laser L from the surface of the substrate 21 when the laser L is emitted through the substrate 21.

According to the illustrated exemplary embodiment, since the heavily doped p-type semiconductor layer 37 and the heavily doped n-type semiconductor layer 39 are used to form the tunnel junction layer 40, the upper cladding layer 41 may be formed of the n-type semiconductor layer. Accordingly, the lower n-type cladding layer 27 and the upper n-type cladding layer 41 may be formed of substantially the same material of the same conductivity type, thereby improving heat dissipation efficiency.

Furthermore, the n-type contact layer may be used, instead of a conventional p-type contact layer, thereby preventing light loss caused by the p-type semiconductor and reducing the resistance.

FIGS. 3 through 9 are schematic cross-sectional views illustrating a method of manufacturing a vertical-cavity surface-emitting laser device according to an exemplary embodiment.

Figure 3:
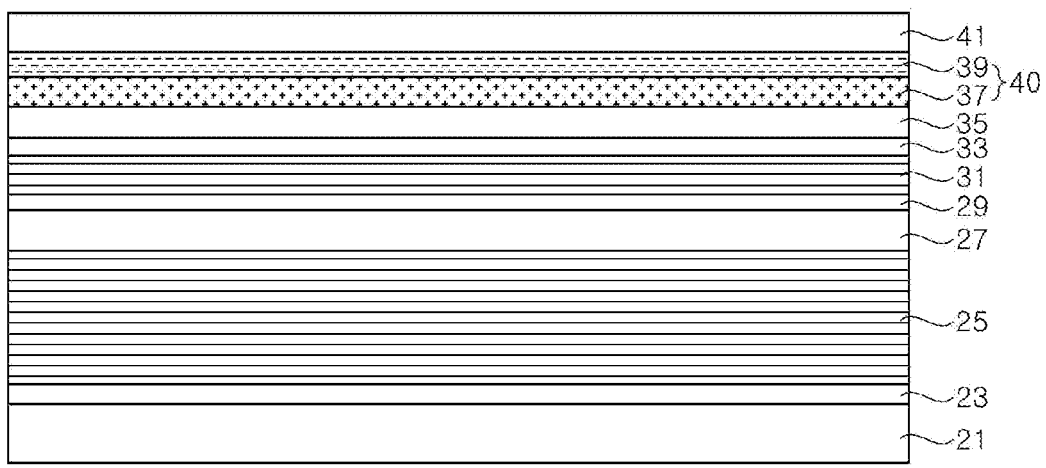
FIGS. 3, 4, 5, 6, 7, 8, and 9 are schematic cross-sectional views illustrating a method of manufacturing a vertical-cavity surface-emitting laser device according to an exemplary embodiment.

First, referring to FIG. 3, a buffer layer 23, a lower mirror 25, a lower n-type cladding layer 27, a lower spacer layer 29, an active region 31, an upper spacer layer 33, an etch stop layer 35, a heavily doped p-type semiconductor layer 37, a heavily doped n-type semiconductor layer 39, and an upper n-type cladding layer 41 are formed on the substrate 21. These layers may be formed sequentially using, for example, metal organic chemical vapor deposition.

The substrate 21 may be a semi-insulating InP substrate, and the buffer layer 23 may be formed of undoped InP. The lower n-type cladding layer 27 includes an n-type contact layer, and the upper n-type cladding layer 41 also includes an n-type contact layer. In addition, the heavily doped p-type semiconductor layer 37 and the heavily doped n-type semiconductor layer 39 form a tunnel junction layer 40. Each layer is the same as that described above, and thus, repeated description thereof will be omitted to avoid redundancy.

Figure 4:
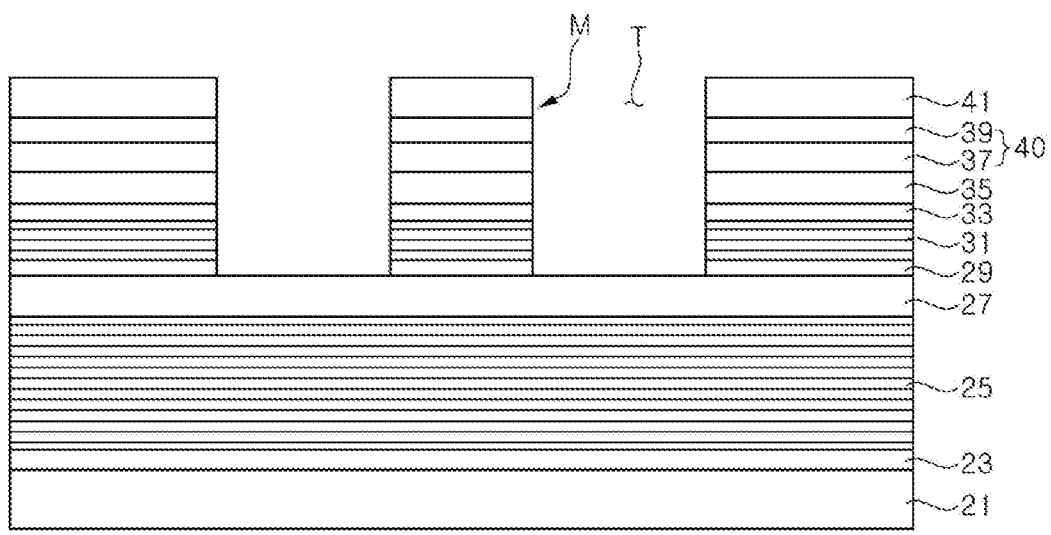

Referring to FIG. 4, a trench T exposing the lower n-type cladding layer 27 is formed through the upper n-type cladding layer 41, the heavily doped n-type semiconductor layer 39, the heavily doped p-type semiconductor layer 37, the etch stop layer 35, and the spacer layers 33 and 29, and the active region 31. The trench T may be formed to have substantially a ring shape surrounding a mesa M.

Figure 5:
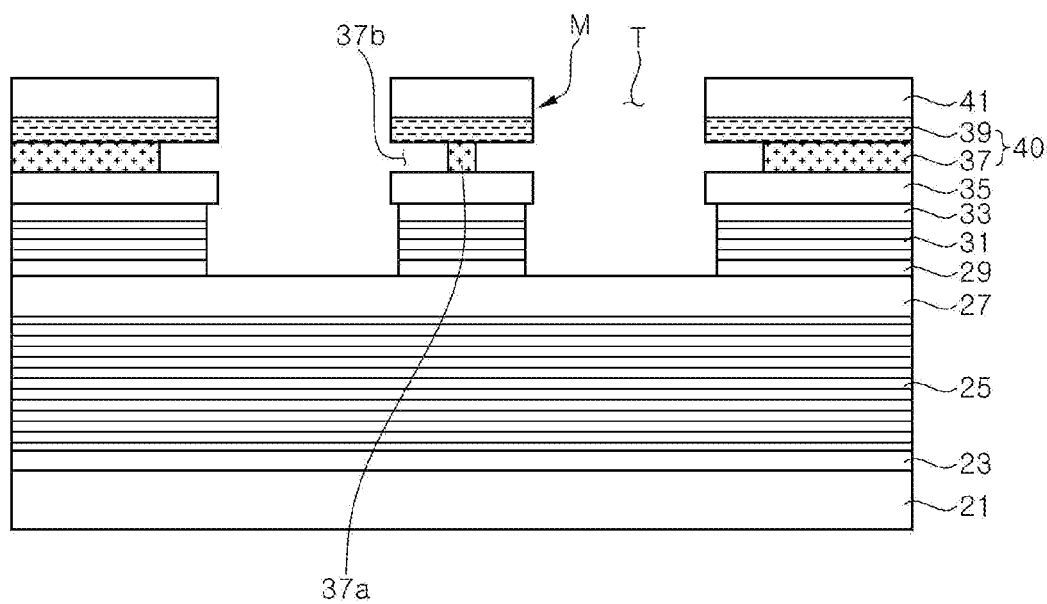

Referring to FIG. 5, side surfaces of the heavily doped p-type semiconductor layer 37 are etched using a wet etching technique. Accordingly, the heavily doped p-type semiconductor layer 37 is recessed from the trench T to form an aperture 37a surrounded by an air gap 37b.

While wet etching, sidewalls of the spacer layers 29 and 33 and the active region 31 may also be recessed. However, the spacer layers 29 and 33 and the active region 31 are less recessed than the heavily doped p-type semiconductor layer 37.

Figure 6:
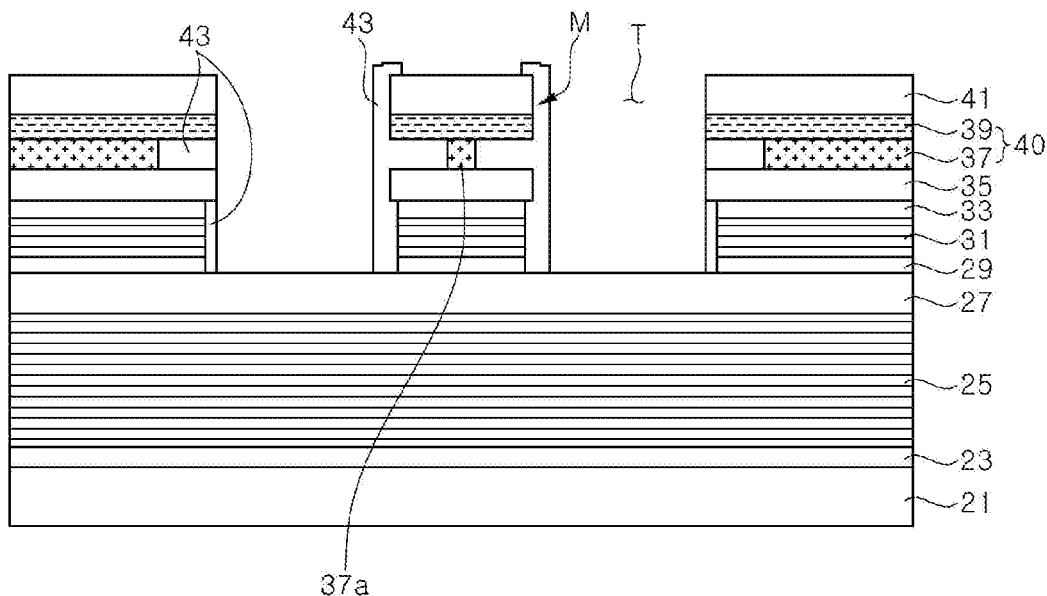

Referring to FIG. 6, a lower insulation layer 43 is formed using atomic layer deposition (ALD) technique. For example, an insulation layer, such as $Al_2O_3$, AlN, or the like, may be deposited through the ALD technique at a temperature of 150° C. to 400° C. The lower insulation layer 43 may fill the recessed regions, and may cover a bottom and sidewalls of the trench T, and an upper surface of the upper n-type cladding layer 41. The lower insulation layer 43 also fills the air gap 37b to surround the aperture 37a.

Subsequently, portions of the lower insulation layer 43 formed on the upper n-type cladding layer 41 and the lower n-type cladding layer 27 are removed using photolithography and etching techniques. Accordingly, the lower insulation layer 43 may fill the recessed region of the heavily doped p-type semiconductor layer 37, and may cover sidewall of the mesa M. Furthermore, a portion of the lower insulation layer 43 may partially cover the upper surface of the upper n-type cladding layer 41 along an edge of the mesa M.

Figure 7:
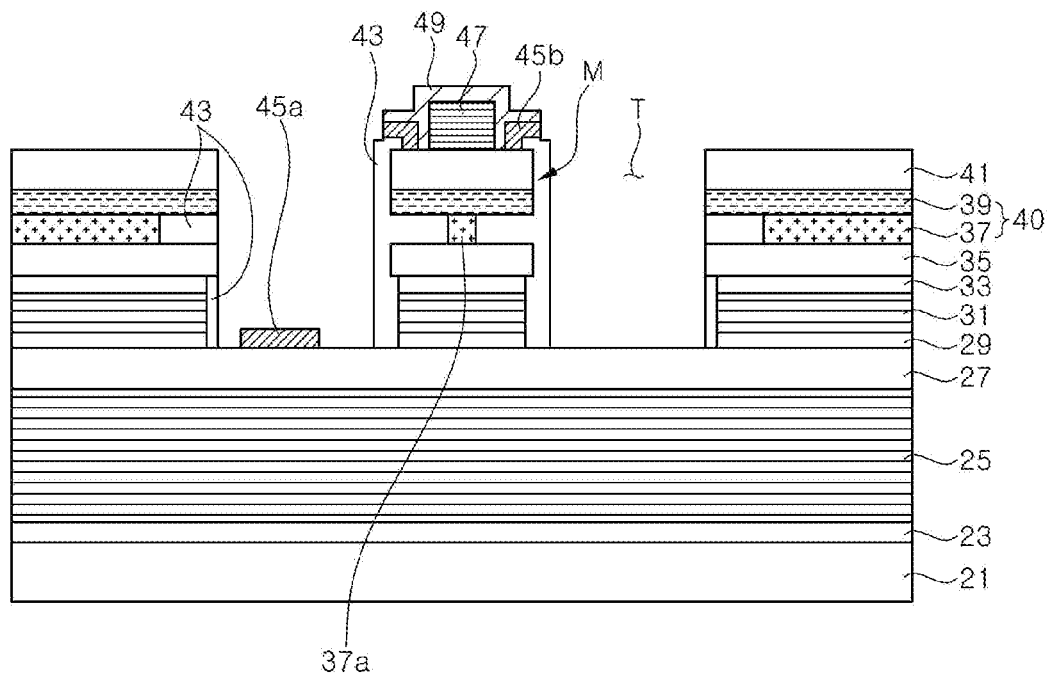

Referring to FIG. 7, an upper mirror 47 is formed on the mesa M. The upper mirror 47 may have a structure, in which layers having different refractive indices are alternately stacked one above another. For example, the upper mirror 47 may be formed using semiconductor layers or dielectric layers.

A lower ohmic contact layer 45a and an upper ohmic contact layer 45b are formed on the upper n-type cladding layer 41 exposed through the trench T and on the upper n-type cladding layer 41 exposed around the upper mirror 47, respectively. In the illustrated exemplary embodiment, the lower ohmic contact layer 45a and the upper ohmic contact layer 45b may be formed together with the same material in the same process.

The lower ohmic contact layer 45a may be formed to have a substantially open ring shape surrounding the mesa M. The upper ohmic contact layer 45b may be formed to have substantially a ring shape surrounding the upper mirror 47, and an outer edge thereof may be disposed on the lower insulation layer 43.

In the illustrated exemplary embodiment, the ohmic contact layers 45a and 45b are described as being formed after the upper mirror 47 is first formed, the ohmic contact layers 45a and 45b are described as being formed first and then the upper mirror 47 may be formed. However, the inventive concepts are not limited thereto. For example, in another exemplary embodiment, the upper mirror 47 may be first formed on the upper n-type cladding layer 41 before forming the trench T.

A metal reflection layer 49 is formed on the upper mirror 47. The metal reflection layer 49 is formed of a metal layer reflecting light generated in the active region 31, and may be formed of, for example, Ti/Au.

Figure 8:
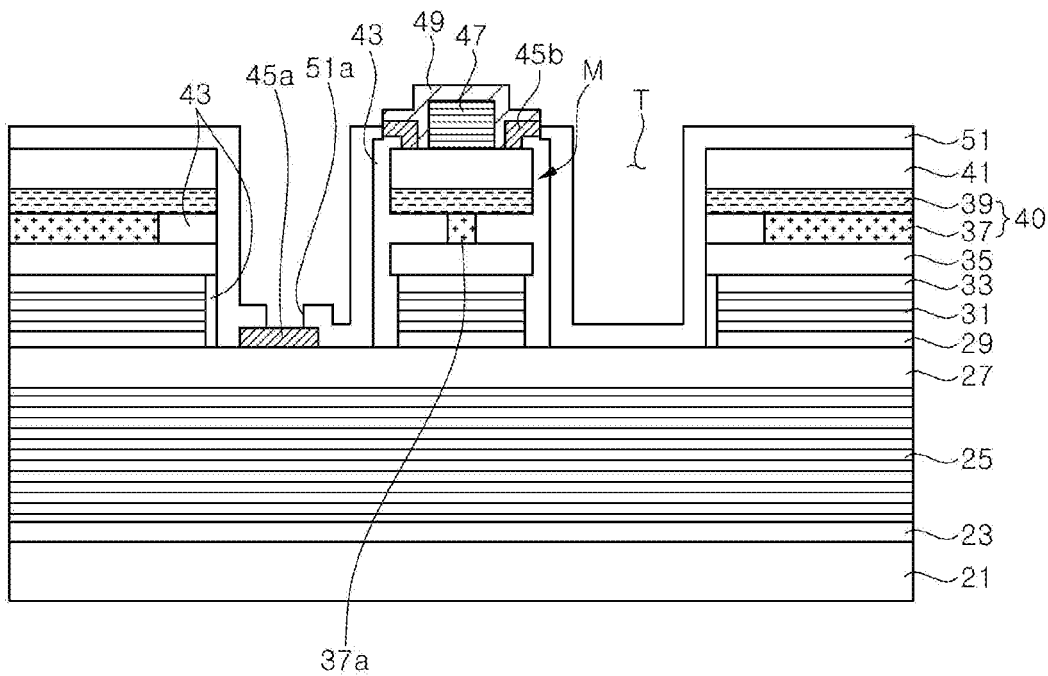

Referring to FIG. 8, an upper insulation layer 51 is formed. The upper insulation layer 51 may be formed to cover the upper n-type cladding layer 41, the metal reflection layer 49, and inner walls and bottoms of the trench T. Thereafter, the upper insulation layer 51 may be patterned to expose the lower ohmic contact layer 45a and the metal reflection layer 49 using photolithography and etching techniques. As shown in FIG. 8, an opening Ma may be formed on the lower ohmic contact layer 45a, and at least a portion of the metal reflection layer 49 may be exposed.

Figure 9:
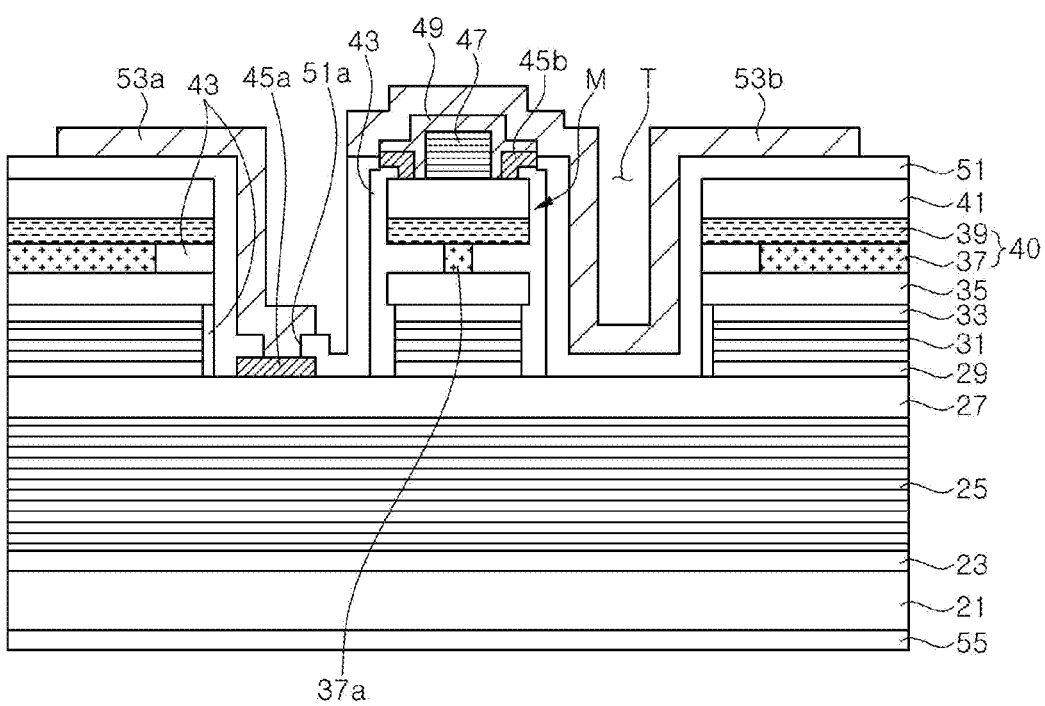

Referring to FIG. 9, a first electrode pad 53a and a second electrode pad 53b are formed on the upper insulation layer 51. The first electrode pad 53a may be electrically connected to the lower ohmic contact layer 45a through the opening 51a, and the second electrode pad 53b may be electrically connected to the metal reflection layer 49. The first and second electrode pads 53a and 53b may be formed of Ti/Pt/Au, for example.

After a lower surface of the substrate 21 may be grinded to reduce a thickness of the substrate 21, an anti-reflection layer 55 may be formed.

Subsequently, the substrate 21 may be divided into individual device units, thereby providing a laser device 100 as shown in FIG. 1.

Figure 10:
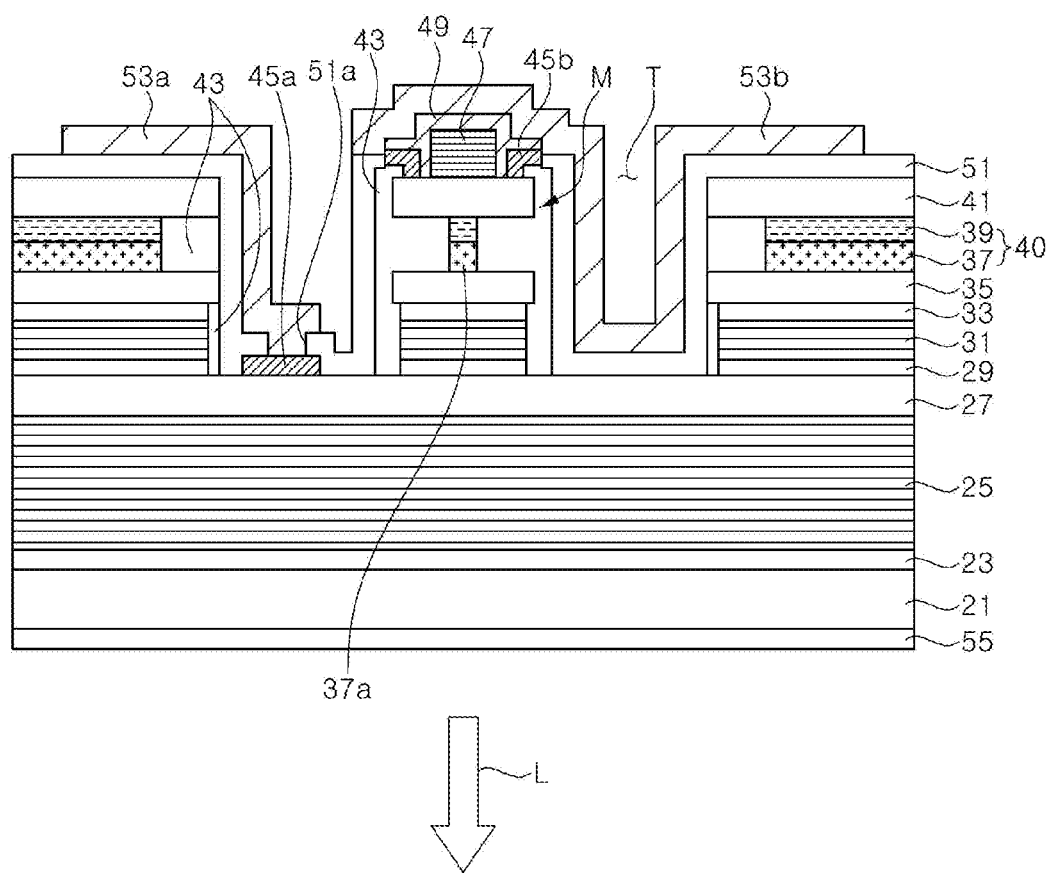
FIG. 10 is a schematic cross-sectional view illustrating a vertical-cavity surface-emitting laser device according to another exemplary embodiment.

FIG. 10 is a schematic cross-sectional view illustrating a vertical-cavity surface-emitting laser device according to another exemplary embodiment.

Referring to FIG. 10, the laser device according to the illustrated exemplary embodiment is generally similar to the laser device 100 described above with reference to FIG. 1 and FIG. 2, except that a heavily doped n-type semiconductor layer 39 is also recessed similarly to a heavily doped p-type semiconductor layer 37 to form an aperture 37a.

The heavily doped n-type semiconductor layer 39 may also include a semiconductor including As, for example, n++ InAlGaAs or n++ InAlAs, similarly to the heavily doped p-type semiconductor layer 37. As such, the heavily doped n-type semiconductor layer 39 may also be etched together while wet etching the heavily doped p-type semiconductor layer 37.

Recessed regions of the heavily doped n-type semiconductor layer 39 and the heavily doped p-type semiconductor layer 37 may be filled with a lower insulation layer 43.

According to the illustrated exemplary embodiment, an elevation of the aperture 37a may be increased, and thus, current may be further concentrated in a region of the aperture 37a.

According to exemplary embodiments, the laser device includes a tunnel junction so as to utilize an n-type contact layer rather than a p-type contact layer. In this manner, it is possible to provide a vertical-cavity surface-emitting laser device capable of improving heat dissipation performance, and reducing light loss and resistance.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A vertical-cavity surface-emitting laser device, comprising:
    a lower mirror;
    an upper mirror disposed over the lower mirror;
    an active region disposed between the lower mirror and the upper mirror;
    a lower n-type cladding layer disposed between the active region and the lower mirror;
    an upper n-type cladding layer disposed between the active region and the upper mirror;
    a heavily doped p-type semiconductor layer disposed between the active region and the upper n-type cladding layer;
    a heavily doped n-type semiconductor layer disposed between the heavily doped p-type semiconductor layer and the upper n-type cladding layer to form a tunnel junction with the heavily doped p-type semiconductor layer; and
    an etch stop layer disposed between the active region and the heavily doped p-type semiconductor layer.

2. The vertical-cavity surface-emitting laser device of claim 1, wherein the heavily doped p-type semiconductor layer includes p++ InAlAs or p++ InAlGaAs.

3. The vertical-cavity surface-emitting laser device of claim 2, wherein the heavily doped n-type semiconductor layer includes n++ InP, n++ InAlGaAs, or n++ InAlAs.

4. The vertical-cavity surface-emitting laser device of claim 3, wherein the heavily doped n-type and p-type semiconductor layers have a doping concentration in a range of $2E19/cm^3$ to $5E19/cm^3$, respectively.

5. The vertical-cavity surface-emitting laser device of claim 1, wherein the etch stop layer includes p-type InP.

6. The vertical-cavity surface-emitting laser device of claim 1, wherein:
    the active region includes barrier layers and a well layer disposed between the barrier layers; and
    the barrier layers and the well layer include an InAlGaAs-based semiconductor.

7. The vertical-cavity surface-emitting laser device of claim 6, further comprising InAlGaAs-based spacer layers in contact with the active region and disposed on both sides of the active region.

8. The vertical-cavity surface-emitting laser device of claim 1, wherein the lower and upper n-type cladding layers include an n-type contact layer, respectively.

9. The vertical-cavity surface-emitting laser device of claim 8, further comprising a lower ohmic contact layer and an upper ohmic contact layer connected to the lower n-type cladding layer and the upper n-type cladding layer, respectively.

10. The vertical-cavity surface-emitting laser device of claim 9, wherein the lower and upper ohmic contact layers include AuGe.

11. The vertical-cavity surface-emitting laser device of claim 9, further comprising an insulation layer partially disposed between the upper n-type cladding layer and the upper ohmic contact layer, and separating an outer edge of the upper ohmic contact layer from the upper n-type cladding layer.

12. The vertical-cavity surface-emitting laser device of claim 1, wherein:
the lower mirror includes a distributed Bragg reflector defined by repeatedly stacked InAlAs and InAlGaAs one above another; and
the upper mirror includes a distributed Bragg reflector defined by repeatedly stacked dielectric layers having different refractive indices one above another.

13. The vertical-cavity surface-emitting laser device of claim 1, further comprising an InP substrate disposed under the lower mirror,
wherein laser beam is configured to be emitted through the substrate.

14. A vertical-cavity surface-emitting laser device, comprising:
a lower mirror;
an upper mirror disposed over the lower mirror;
an active region disposed between the lower mirror and the upper mirror;
a lower n-type cladding layer disposed between the active region and the lower mirror;
an upper n-type cladding layer disposed between the active region and the upper mirror;
a heavily doped p-type semiconductor layer disposed between the active region and the upper n-type cladding layer; and
a heavily doped n-type semiconductor layer disposed between the heavily doped p-type semiconductor layer and the upper n-type cladding layer to form a tunnel junction with the heavily doped p-type semiconductor layer,
wherein the lower and upper n-type cladding layers respectively include an n-type contact layer including InP doped with an n-type impurity at a concentration in a range of $5E18/cm^3$ to $1E19/cm^3$.

15. A vertical-cavity surface-emitting laser device, comprising:
a lower mirror;
an upper mirror disposed over the lower mirror;
an active region disposed between the lower mirror and the upper mirror;
a lower n-type cladding layer disposed between the active region and the lower mirror;
an upper n-type cladding layer disposed between the active region and the upper mirror;
a heavily doped p-type semiconductor layer disposed between the active region and the upper n-type cladding layer;
a heavily doped n-type semiconductor layer disposed between the heavily doped p-type semiconductor layer and the upper n-type cladding layer to form a tunnel junction with the heavily doped p-type semiconductor layer;
a ring-shaped trench exposing the lower n-type cladding layer; and
a mesa surrounded by the trench,
wherein:
the mesa comprises the active region, the heavily doped p-type semiconductor layer, the heavily doped n-type semiconductor layer, and the upper n-type cladding layer; and
the upper mirror is disposed on the upper n-type cladding layer on the mesa.

16. The vertical-cavity surface-emitting laser device of claim 15, further comprising:
an upper ohmic contact layer having a ring shape disposed around the upper mirror and in ohmic contact with the upper n-type cladding layer; and
a lower ohmic contact layer in ohmic contact with the lower n-type cladding layer exposed through the trench.

17. The vertical-cavity surface-emitting laser device of claim 16, further comprising a metal reflection layer covering the upper mirror.

18. The vertical-cavity surface-emitting laser device of claim 17, further comprising first and second electrode pads electrically connected to the lower ohmic contact layer and the metal reflection layer, respectively.

19. The vertical-cavity surface-emitting laser device of claim 18, further comprising an upper insulation layer covering sidewalls and bottom of the trench, the upper insulation layer having openings exposing the lower ohmic contact layer and the metal reflection layer,
wherein the first and second electrode pads are disposed on the upper insulation layer, and electrically connect to the lower ohmic contact layer and the metal reflection layer through the openings, respectively.

* * * * *